United States Patent
Caspary et al.

(10) Patent No.: US 11,418,214 B1
(45) Date of Patent: Aug. 16, 2022

(54) EFFECTIVE SEEDING OF CRC FUNCTIONS FOR FLOWS' PATH POLARIZATION PREVENTION IN NETWORKS

(71) Applicant: Cisco Technology, Inc., San Jose, CA (US)

(72) Inventors: Guy Caspary, Haifa (IL); Nadav Tsvi Chachmon, Moshav Yaad (IL); Aviran Kadosh, Moreshet (IL)

(73) Assignee: CISCO TECHNOLOGY, INC., San Jose, CA (US)

( * ) Notice: Subject to any disclaimer, the term of this patent is extended or adjusted under 35 U.S.C. 154(b) by 61 days.

(21) Appl. No.: 17/000,762

(22) Filed: Aug. 24, 2020

Related U.S. Application Data

(60) Provisional application No. 62/992,197, filed on Mar. 20, 2020.

(51) Int. Cl.
  *H03M 13/09* (2006.01)
  *H04L 1/00* (2006.01)
  *H04L 47/125* (2022.01)
  *H04L 45/7453* (2022.01)

(52) U.S. Cl.
  CPC .......... *H03M 13/09* (2013.01); *H04L 1/0041* (2013.01); *H04L 1/0061* (2013.01); *H04L 45/7453* (2013.01); *H04L 47/125* (2013.01)

(58) Field of Classification Search
  CPC .... H03M 13/09; H04L 1/0041; H04L 1/0061; H04L 45/7453; H04L 47/125
  See application file for complete search history.

(56) References Cited

U.S. PATENT DOCUMENTS

| | | | |
|---|---|---|---|
| 8,660,005 B2 | 2/2014 | Roitshtein et al. | |
| 9,455,966 B2 | 9/2016 | Roitshtein et al. | |
| 9,503,378 B2 | 11/2016 | Pan | |
| 10,218,629 B1* | 2/2019 | An | H04L 45/22 |
| 2012/0230194 A1* | 9/2012 | Matthews | H04L 47/125 370/235 |
| 2015/0281089 A1* | 10/2015 | Marchetti | H04L 47/125 370/235 |

OTHER PUBLICATIONS

C. Hopps, "Analysis of an Equal-Cost Multi-Path Algorithm", Network Working Group, Request for Comments: 2992, Category: Informational, Nov. 2000, 8 pages.

(Continued)

*Primary Examiner* — Guy J Lamarre
(74) *Attorney, Agent, or Firm* — Edell, Shapiro & Finnan, LLC

(57) ABSTRACT

A network element is configured to efficiently load balance packets through a computer network. The network element receives a packet associated with flow attributes and generates a Load Balancing Flow Vector (LBFV) from the flow attributes. The network element partitions the LBFV into a plurality of LBFV blocks and reorders the LBFV blocks to generate a reordered LBFV. The LBFV blocks are reordered based on a reordering sequence that is different from reordering sequences on other network elements in the computer network. The network element hashes the reordered LBFV to generate a hash key for the packet and selects a next hop link based on the hash key. The next hop link connects the network elements to a next hop network element in the computer network.

20 Claims, 6 Drawing Sheets

(56) References Cited

OTHER PUBLICATIONS

Pearson, Peter K., "Fast Hashing of Variable-Length Text Strings", vol. 33, No. 6, Jun. 1990, 4 pages.
Xthuijs, "ASR9000/XR: Load-balancing architecture and characteristics", https://community.cisco.com/t5/tkb/articleprintpage/tkb-id/4441-docs-service-providers/article-id/1684, Aug. 28, 2012, 172 pages.

* cited by examiner

EFFECTIVE SEEDING OF CRC FUNCTIONS FOR FLOWS' PATH POLARIZATION PREVENTION IN NETWORKS

CROSS REFERENCE TO RELATED APPLICATION

This application claims priority to U.S. Provisional Application No. 62/992,197, filed Mar. 20, 2020, the entirety of which incorporated by reference.

TECHNICAL FIELD

The present disclosure relates to optimizing network operations particularly in the context of multiple stages of Equal-Cost Multi-Path (ECMP) routing decisions.

BACKGROUND

Equal-Cost Multi-Path (ECMP) is a routing technique for routing network traffic along multiple paths between nodes of a computer network. Due to the topology of the computer network each path selected in an ECMP routing technique is essentially equivalent, and may be used to load balance traffic flow across multiple network elements.

When an ECMP routing technique is implemented in stages of a computer network, the routing decisions of the network elements may be correlated across the stages. The polarization of routing decisions across stages of an ECMP routing technique results in non-optimal network utilization. The use of Cyclic Redundancy Check (CRC) functions for load balancing may cause, or exacerbate, the issue of polarization, due to the fact that a CRC seed (i.e. initial value) does not affect the distribution of routing decisions. Existing Massively Scalable Data Centers (MSDCs) have deployed large networks and have run into polarization problems and are actively looking for a solution to the problem.

DESCRIPTION OF EXAMPLE EMBODIMENTS

Overview

Figure 1:
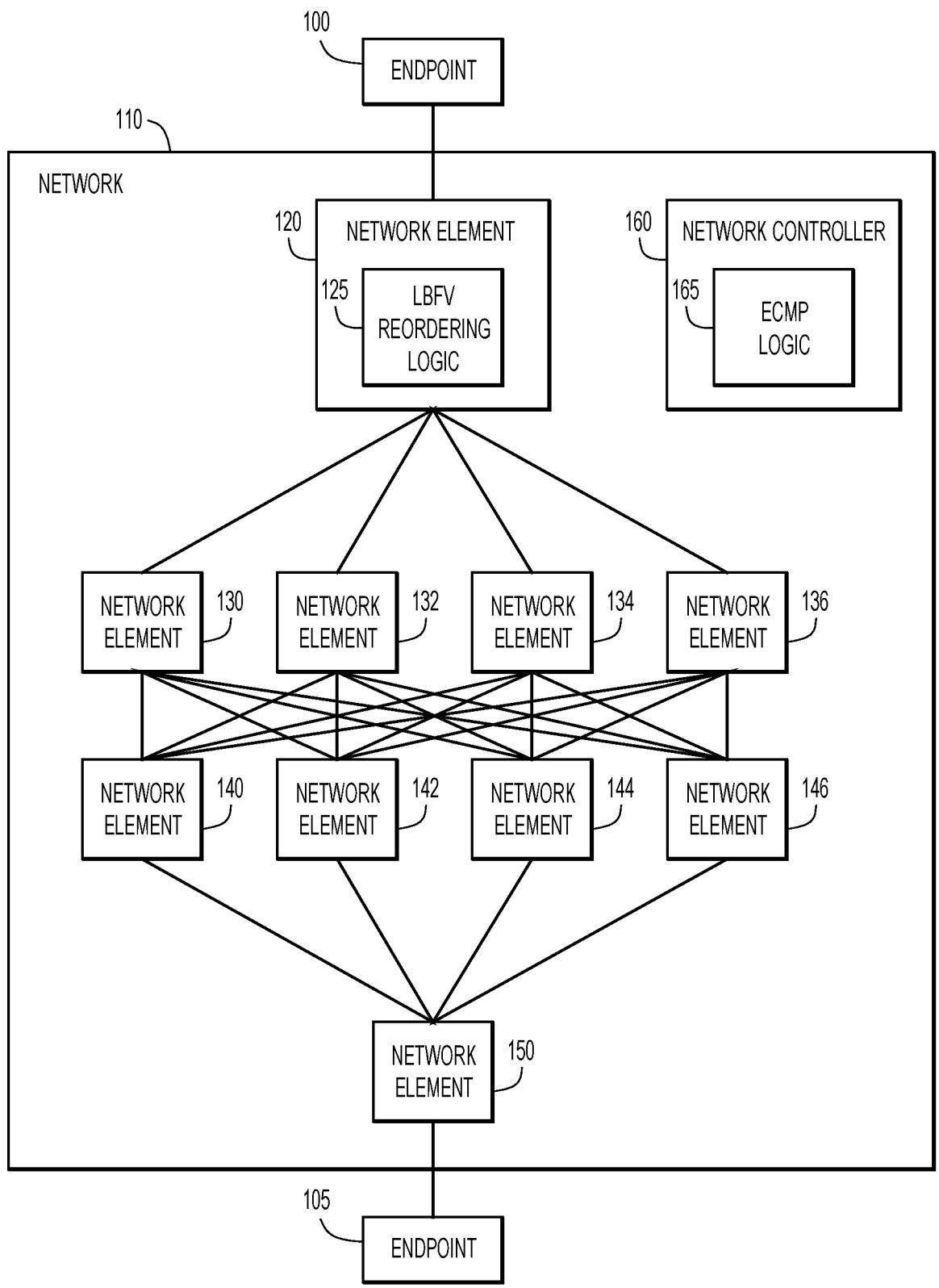
FIG. 1 is a simplified block diagram illustrating a computer network that implements ECMP routing decisions, according to an example embodiment.

A computer implemented method is provided to efficiently load balance packets through a network. The method includes receiving a packet associated with flow attributes at a first network element. The first network element is connected to a plurality of second network elements of a computer network. The method also includes generating a Load Balancing Flow Vector (LBFV) from the flow attributes, and partitioning the LBFV into a plurality of LBFV blocks. The method further includes reordering the LBFV blocks at the first network element to generate a reordered LBFV. The LBFV blocks are reordered based on a first reordering sequence that is different from reordering sequences on the plurality of second network elements. The method also includes hashing the reordered LBFV to generate a hash key for the packet and selecting a next hop link based on the hash key. The next hop link connects the first network elements to a next hop network element among the plurality of second network elements.

Example Embodiments

Some network protocols, such as Transport Control Protocol (TCP), perform better if the path they flow along does not change while the stream is connected. When there are multiple paths from source to destination it would be desirable to utilize the same paths for each flow to achieve better network efficiency (e.g., higher available bandwidth, reduced packet latency).

Equal-Cost Multi-Path (ECMP) routing describes a technique for routing along multiple network paths of equal cost. In each network element, a forwarding engine determines a next hop based on the available destinations of the packet and set of unique attributes which are common to all packets that should be routed in same path. In order to make the forwarding decision, the set of unique attributes that are chosen per packet are constructed into Load-Balancing Flow-Vector (LBFV). An example of an LBFV is a 5-tuple identifying the source and destination of network flow of packets. For instance, the 5-tuple may include a source Internet Protocol (IP) address, a destination IP address, a source port, a destination port, and a protocol of the flow. The 5-tuple may be reconstructed from the packet headers in each packet of the network flow. The LBFV may be processed with a hash function to generate a hash-key. A common hash function is a Cyclic Redundancy Function (CRC) function. The hash key (e.g., the remainder of the CRC function) may then be mapped to a link number from the range of eligible outgoing links.

Given that all packets with a same LBFV will go through the process described above, all equal LBFVs originated from different packets will be mapped to the same outgoing link and overall will route along same network path, which makes ECMP friendly for protocols such as TCP. The utilization of different paths is achieved due the fact that each flow will have different LBFVs which would cover additional available paths.

However, if the network flow passes through multiple stages of ECMP routing decisions, and the forwarding engine at each stage is generating the same LBFV, a correlation between ECMP decisions across the stages will occur. As a result, only a portion of the network's multiple paths may be utilized. The techniques described herein cause a differentiation in the LBFV generation so ECMP decisions of different stages in the network will not be correlated.

The LBFV used for selecting an outgoing link to the next stage of the ECMP routing is differentiated by manipulating the LBFV differently at each network element. In one example, the network element may partition the underlying LBFV into blocks and reorder the blocks in a different sequence before hashing the reordered LBFV to determine an outgoing network link.

Other solutions to manipulate and differentiate the LBFV at different network elements include adding or subtracting a random number that is unique to the network element (e.g., a serial number) at a fixed or random location in the underlying LBFV. However, merely changing the LBFV by a predetermined number at the same position in each network element may not effectively randomize the remainder of CRC functions that are typically used to hash LBFV and select outgoing network links. In one example, the LBFV may add or subtract a random, unique number at a location that is specific to each network element, as well as reordering the LBFV as described herein.

A network operator may implement different CRC functions in different network elements to differentiate the LBFV, but this solution does not scale to high levels. The number of effective CRC functions is limited to the number of primitive polynomials, and all of the CRC functions would need to be implemented in each network element, increasing the production cost and complexity.

Another solution to address the issue of polarization in ECMP routing includes using a unique table at each network element to directly map the hash key to the outgoing link number. However, using a table to map a 16-bit CRC remainder to link numbers requires the use of memory dedicated to the table and adds latency to the solution. A further solution would be to implement complex cryptographic functions with a unique seed at each network element. However, these cryptographic functions require a larger physical area to implement, and add additional latency to the solution.

Referring now to FIG. 1, a simplified block diagram shows a network embodiment of an ECMP network between a source endpoint 100 and a destination endpoint 105. The source endpoint 100 is connected to the network 110 at a network element 120. The network element 120 includes LBFV reordering logic 125 that enables the network element 120 to change the LBFV when making the ECMP routing decision. The network element 120 is connected to four network elements 130, 132, 134, and 136 in the next stage of the route between the source endpoint 100 and the destination endpoint 105. Each of the network elements 130, 132, 134, and 136 are also connected to four additional network elements 140, 142, 144, and 146 in the next stage of the flow route. Each of the network elements 140, 142, 144, and 146 is connected to a network element 150 in the final stage of the flow route. The network element 150 is connected to the destination endpoint 105.

In one example, each of the network elements 130, 132, 134, 136, 140, 142, 144, 146, and 150 may include similar logic to the LBFV reordering logic 125 included in network element 120. All of the network elements in the network 110 are controlled by a network controller 160 that includes ECMP logic 165 configured to program each network element to make ECMP routing decisions according to the techniques described herein.

In another example, flow route through the network 110 between the source endpoint 100 and the destination endpoint 105 may be described in stages. The first stage of the flow route is network element 120. The second stage of the flow route includes network elements 130, 132, 134, and 136. The third stage in the flow route includes network elements 140, 142, 144, and 146. The network topology shown in FIG. 1 is a fully meshed network between the second and third stages, but other embodiments may also benefit from the techniques described herein.

For instance, each network element 130, 132, 134, and 136 in the second stage may be connected to separate network elements in the third stage, rather than connecting to the same four network elements 140, 142, 144, and 146, as shown in FIG. 1. In other words, the third stage may include a total of sixteen network elements (i.e., four network elements in the third stage for each of the four network elements in the second stage).

In a further example, the ECMP network 110 may be configured to fan out to more (or fewer) than four elements in the next stage, and may include more stages in the flow route. In other words, in another embodiment of ECMP network 110, the network element 120 may connect to more than the four network elements 130, 132, 134, and 136. Additionally, there may be additional stages of network elements similar to the second stage (i.e., network elements 130, 132, 134, and 136) and the third stage (i.e., network elements 140, 142, 144, and 146).

In one example, the source endpoint 100 may send a flow of packets to the destination endpoint 105. Each packet from the source endpoint 100 has an LBFV associated with the particular flow. The network element 120 maps the LBFV for the packet to one of the available links to forward the packet to the next hop (e.g., the third link to network element 134). If the next hop network element (e.g., network element 134) were to map the same LBFV according to the same method to determine the outgoing link (i.e., the third link to network element 144), then certain links in the network 110 would never see any traffic, leading to inefficiency in the network 110. In other words, if the LBFV is mapped to an outgoing link according to the same method in each stage of the network 110, then 75% of the links will never see any traffic because selecting the third outgoing link in the first stage means every other network element in the flow path will also select the third outgoing link.

To overcome the polarization of load balancing the network 110, each network element may reorder (i.e., shuffle) the LBFV according to a different reordering sequence. The underlying LBFV (e.g., the 5-tuple of network addresses/ports and protocol) remains the same for any particular flow, but each network element may reorder the underlying LBFV differently before mapping the reordered LBFV to an outgoing link. This enables each network element to consistently route packets in a flow (i.e., with the same underlying LBFV) differently and mitigate the issue of polarization in the ECMP routing through the network 110.

Another way of describing ECMP networks (e.g., network 110) is in terms of a network tree with X stages and Y fanout, which describes all of the possible routes through the network. For instance, the network 110 can be described as having two stages with ECMP decisions to route a packet from the source endpoint 100 to the destination endpoint 105 (i.e., network element 120 and network elements 130, 132, 134, and 136). The network 110 has a fanout of four, since each network element that makes ECMP routing decisions selects from four possible outgoing links. At a higher scale, a large ECMP network may have more stages and/or a larger or smaller fanout.

To illustrate the effectiveness of the techniques presented herein, Table 1 compares load balancing methods on different simulated networks. Each simulation generates packets with a random LBFV value per packet and transmits the packet through the simulated network from a root node to a leaf node according to a specified load balancing method. The final leaf node of each packet is counted as the path taken through the simulated network. An ideal load balancer would distribute an equal number of packets to each leaf node. As a measure of load balancing effectiveness, the simulation calculates a Coefficient of Variation (CV) statistical measure of the standard deviation divided by the mean number of packets. Results closer to the ideal value of zero indicate better load balancing, since the standard deviation approaches zero in the ideal load balancing scenario.

TABLE 1

Simulation results

| Simulation number | Stages | Fanout | Hashing Function | CV |
|---|---|---|---|---|
| 1 | 8 | 4 | Random | 0.142 |
| 2 | 8 | 4 | CRC | 63.993 |
| 3 | 8 | 4 | CRC — reordered LBFV | 0.174 |
| 4 | 5 | 5 | Random | 0.140 |
| 5 | 5 | 5 | CRC | 11.136 |
| 6 | 5 | 5 | CRC — reordered LBFV | 0.147 |

In the simulation results shown in Table 1, three different load balancing methods were simulated on two different networks. The first network has eight stages with a fanout of four, leading to 16,384 leaf nodes (i.e., possible paths through the network). The second network has five stages with a fanout of five, leading to 625 leaf nodes. Each simulation generates a number of packets equal to fifty times the number of leaf nodes (i.e., 819,200 packets for the first network and 31,250 packets for the second network), with each packet having a randomly generated LBFV. The simulations run the packets through the simulated network according to one of three different load balancing methods.

The first load balancing method is random selection, which effectively serves as a reference that is close to ideal. In an actual implementation, a random selection load balancing method would not be useful, since packets with the same LBFV would not be sent along the same path, as required by ECMP. The second load balancing method, which illustrates a typical load balancing scheme in the industry, is hashing the LBFV with a CRC function and mapping the remainder to an outgoing link. The third load balancing method, which illustrates the techniques presented herein, is reordering the LBFV in a different way at each node before hashing the reordered LBFV with a CRC function and mapping the remainder to an outgoing link.

As can be seen in the figure of merit (i.e., the CV value) of Table 1, the load balancing effectiveness of the techniques presented herein (i.e., CRC of reordered LBFV) far exceeds the load balancing effectiveness of the second load balancing method (i.e., simple CRC) that is typically implemented in ECMP networks. Additionally, the third load balancing method achieves an effectiveness that is close to the ideal effectiveness illustrated by the random load balancing method.

Figure 2:
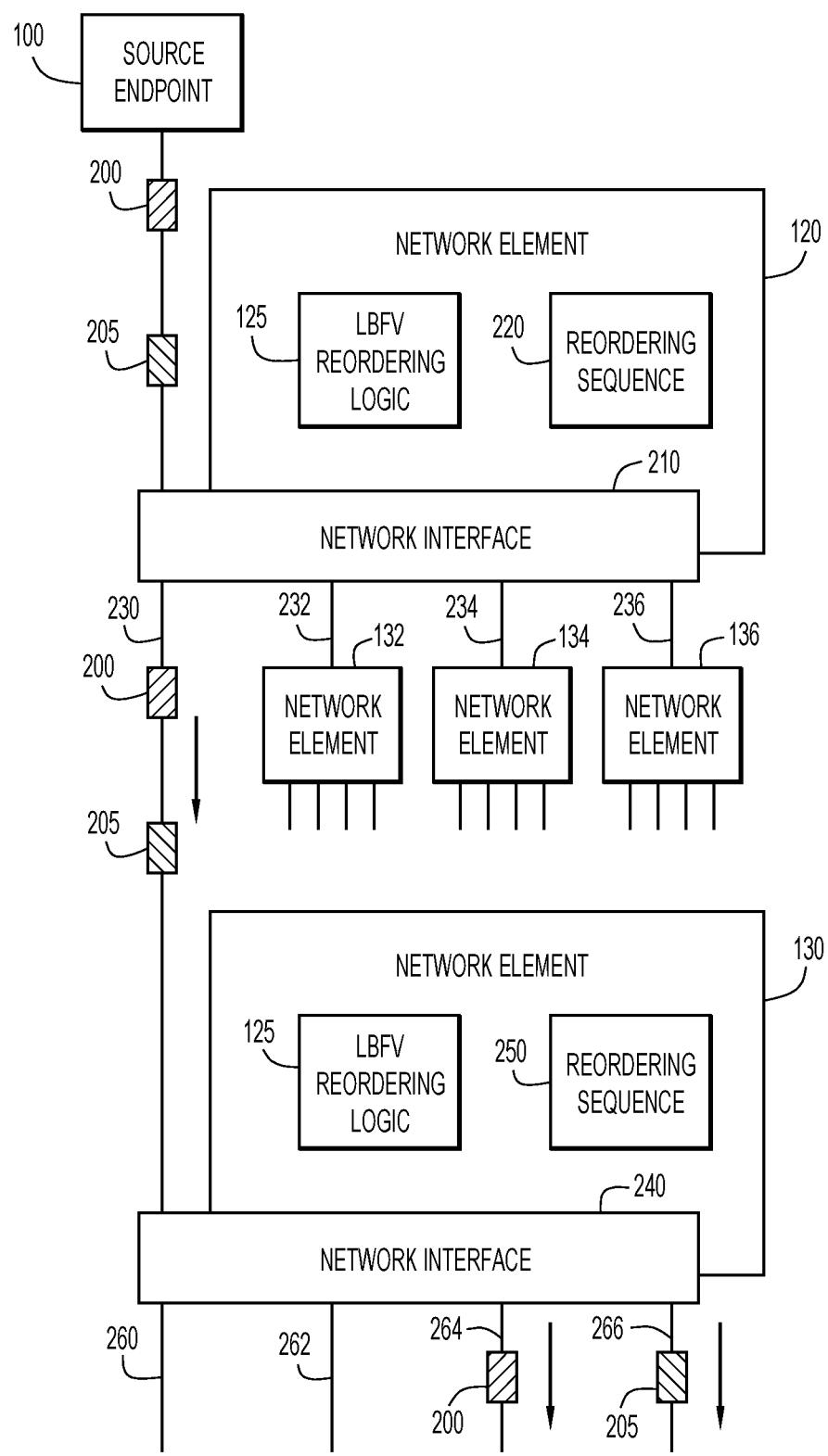
FIG. 2 is a simplified block diagram of network elements configured to implement ECMP routing decisions, according to an example embodiment.

Referring now to FIG. 2, a simplified block diagram illustrates the selection of outgoing links from a network element, according to an example of the techniques presented herein. The source endpoint 100 sends a first packet 200 from a first network flow and a second packet 205 from a second network flow to the network interface 210 of the network element 120. The first packet 200 includes information (e.g., a header) that identifies the first packet 200 as part of the first network flow. For instance, the first packet 200 may include a header with a 5-tuple (e.g., source IP address, a destination IP address, a source port, a destination port, and a protocol) for packets in the first network flow. Similarly, the second packet 205 includes information (e.g., a header) that identifies the second packet 205 as part of the second network flow.

The network element 120 determines a first LBFV for the first packet 200 and the LBFV reordering logic 125 shuffles the first LBFV according to a reordering sequence 220 that is specific to the network element 120. Similarly, the network element 120 determines a second LBFV for the second packet 205 and the LBFV reordering logic 125 shuffles the second LBFV according to the reordering sequence 220.

The network interface 210 of the network element 120 includes four outgoing links 230, 232, 234, and 236, leading to network elements 130, 132, 134, and 136, respectively. To forward the first packet 200 and the second packet 205 from the network element 120, the network element 120 selects among the outgoing links 230, 232, 234, and 236 based on the reordered LBFVs for each packet. In the example shown in FIG. 2, the outgoing link 230 is selected for both the first packet 200 and the second packet 205, and both packets 200 and 205 are forwarded to the network element 130.

The network element 130 receives the first packet 200 and the second packet 205 at the network interface 240, and identifies the same underlying first LBFV for the first packet 200 and the second LBFV for the second packet 205 based on the information identifying the network flow (e.g., the 5-tuple). The LBFV reordering logic 125 in the network element 130 shuffles the first LBFV according to a reordering sequence 250 that is different from the reordering sequence 220 of the network element 120. Similarly, the LBFV reordering logic 125 in the network element 130 shuffles the second LBFV according to the reordering sequence 250.

The network interface 240 of the network element 130 includes four outgoing links 260, 262, 264, and 266, which lead to four subsequent network elements in the network. The network element 130 selects among the outgoing links 260, 262, 264, and 266 based on the reordered first LBFV for the first packet 200. Since the same underlying first LBFV is reordered in the network element 130 according to a different sequence (i.e., reordering sequence 250) than in the network element 120 (i.e., reordering sequence 220), the network element 130 selects a different outgoing link 264 for the first packet 200. The network element 130 also selects among the outgoing links 260, 262, 264, and 266 based on the reordered second LBFV for the second packet 205. The network element 130 selects the outgoing link 266 for the second packet 205 based on the reordered second LBFV that was reordered according to the reordering sequence 250 of the network element 130.

Figure 3:
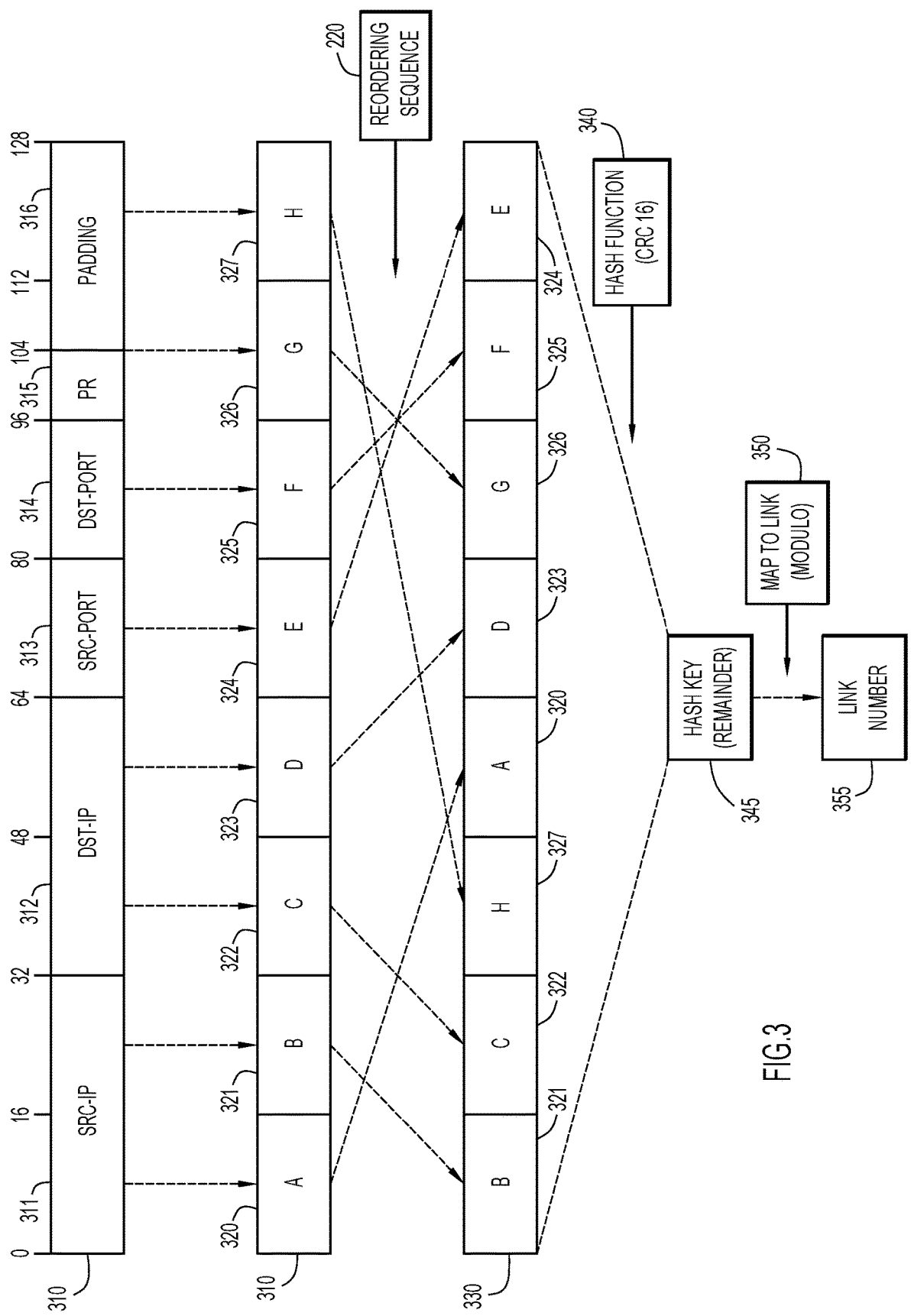
FIG. 3 illustrates reordering a Load Balancing Flow Vector (LBFV) to make ECMP routing decisions, according to an example embodiment.

Referring now to FIG. 3, a diagram illustrates one example of processing a LBFV to select an outgoing link at a network element (e.g., network element 120 as shown in FIG. 1 and FIG. 2). The network element generates a LBFV 310 from identifying information in a packet that is associated with a particular network flow. The LBFV 310 includes 32 bits for the source IP address 311, 32 bits for the destination IP address 312, 16 bits for the source port 313, 16 bits for the destination port 314, 8 bits to identify the protocol 315, and 24 bits of padding 316. To begin the load balancing process, the network element partitions the LBFV 310 into blocks 320-327, also referred to herein as blocks A-H. In one example, the blocks 320-327 are of equal size (e.g., 16 bits), but the blocks 320-327 may also be divided into blocks of unequal length. In another example, the number of blocks into which the LBFV 310 is divided may vary. In other words, the LBFV 310 may be partitioned into more or fewer blocks than the eight blocks 320-327.

The network element 120 is programmed with a reordering sequence 220 that describes how to shuffle the blocks 320-327 to generate the reordered LBFV 330. The reordering sequence 220 moves block in the first position (i.e., block 320) of the LBFV 310 to the fourth position of the reordered LBFV 330. The reordering sequence 220 also moves the blocks in the second, third, fourth, fifth, sixth, seventh, and eighth position of the LBFV 310 to the first, second, fifth, eighth, seventh, sixth, and third position of the reordered LBFV 330, respectively.

The network element processes the reordered LBFV 330 with a hashing formula 340 (e.g., a CRC-16 function) to generate a hash key 345 (e.g., the remainder of the CRC-16 function). The network element performs a mapping operation 350 to map the hash key 345 to an outgoing link number 355 with approximately equal probability to each possible outgoing link. For instance, if the network element has four equivalent outgoing links for ECMP routing, the network element may calculate the link number as:

$$\text{link number} = (\text{hash key}) \text{ modulo } 4 \tag{1}$$

to generate an equal probability of each link number being selected for a random distribution of initial LBFV values.

Figure 4:
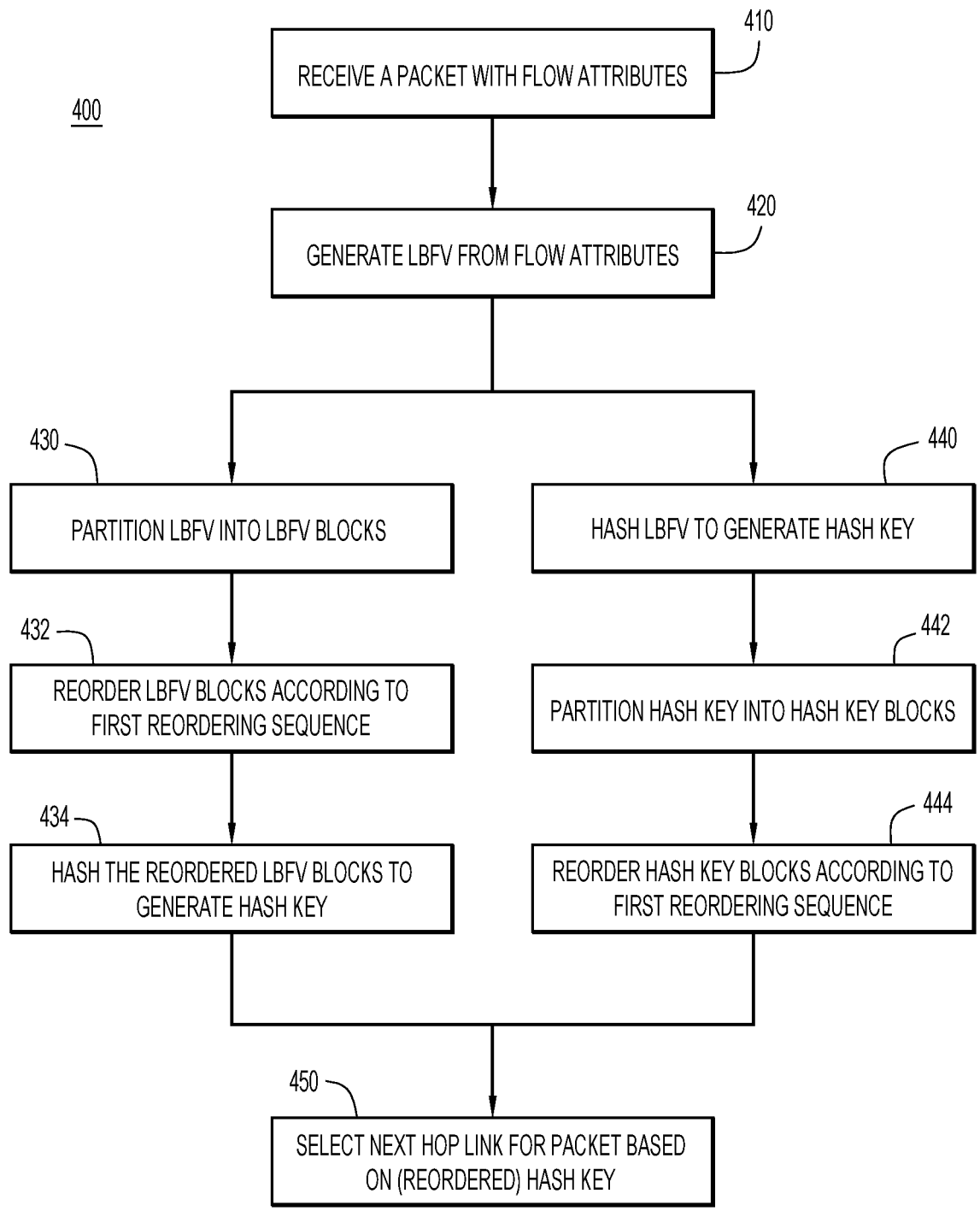
FIG. 4 is a flowchart illustrating operations performed at a network element that implements ECMP routing decisions, according to an example embodiment.

Referring now to FIG. 4, a flowchart illustrates operations performed by a network element (e.g., network element 120) in a process 400 for ECMP routing a packet according to the techniques described herein. At 410, a first network element connected to a plurality of second network elements receives a packet associated with flow attributes. In one example, the flow attributes include a source network port/address, a destination port/address, and a protocol of the network flow. At 420, the network element generates a Load Balancing Flow Vector (LBFV) from the flow attributes. In one example, the network element may pad the flow attributes to fill out the LBFV to a predetermined length.

In one implementation, at 430, the network element partitions the LBFV into a plurality of LBFV blocks. In one example, the LBFV blocks may be of equal or unequal length. At 432, the network element reorders the LBFV blocks according to a first reordering sequence. The first reordering sequence is different from reordering sequences on the plurality of second network elements that are connected to the first network element. In one example, the first reordering sequence may be provided by a network controller. Alternatively, the first network element may randomly determine the first reordering sequence and rely on the statistical probability that the plurality of second elements will not randomly determine the same reordering sequence as the first network element. At 434, the network element hashes the reordered LBFV made from the reordered LBFV blocks. Hashing the reordered LBFV generates a hash key in a deterministic process. In other words, hashing the same LBFV (e.g., from additional packets in the same network flow) will result in the same hash key. In one example, hashing the reordered LBFV comprises calculating a CRC remainder of the reordered LBFV.

In another implementation, at 440, the network element first hashes the LBFV to generate a hash key in a deterministic process. As 442, the network element partitions the hash key into hash key blocks. In one example, the hash key blocks may be of equal or unequal length. At 444, the network element reorders the hash key blocks into a reordered hash key according to the first reordering sequence.

At 450, the network element selects a next hop link based on either the hash key of the reordered LBFV blocks or the reordered hash key of the LBFV. The next hop link connects the first network element to a next hop network element among the plurality of second network elements. In one example, the next hop link is selected by calculating the modulus of the (reordered) hash key with the number of potential next hop links (e.g., the number second network elements connected to the first network element).

In the two implementations, the steps of hashing and reordering the LBFV are essentially reversed. In other words, the network element may perform the hashing process before or after the reordering process.

From a hardware implementation perspective, the techniques presented herein are low latency and require a relatively small area to implement. The techniques may be used to add effective seeding to low latency and low area hash functions. The total solution will have lower latency and/or lower area requirements than complex hash functions. For instance, using a CRC hashing function with the reordering techniques presented herein is more efficient in terms of latency and area than Rivest Cipher 5 (RC5) or Data Encryption Standard (DES) functions with similar load balancing decorrelation.

Figure 5:
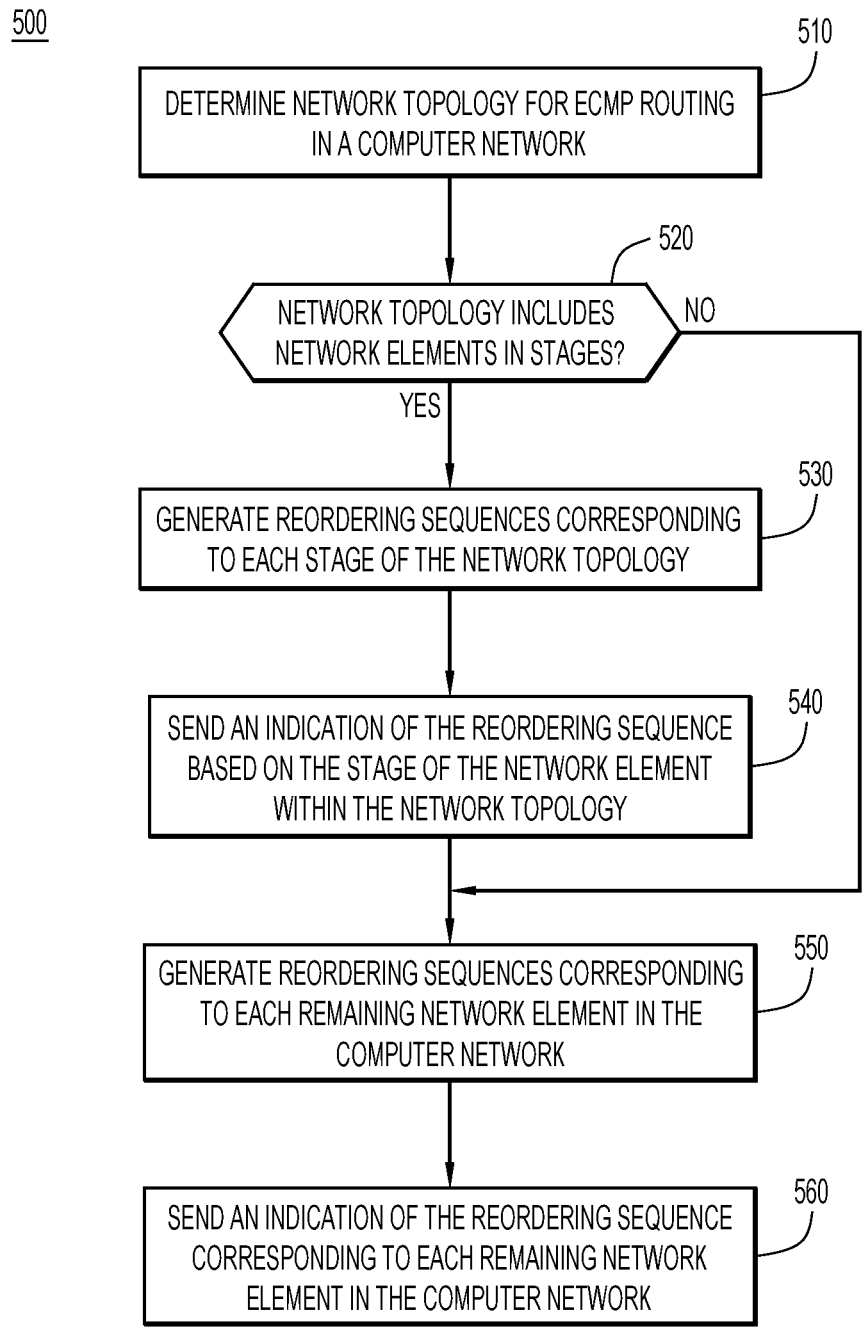
FIG. 5 is a flowchart illustrating operations performed at a network controller to enable network elements to make ECMP routing decisions, according to an example embodiment.

Referring now to FIG. 5, a flowchart illustrates operations performed by a network controller (e.g., network controller 160) in a process 500 for configuring a plurality of network elements for decorrelated ECMP routing according to the techniques described herein. At 510, the network controller determines the network topology for ECMP routing through a computer network composed of a plurality of network elements. In one example, the network controller may be programmed with the network topology (e.g., the connections between the plurality of the network elements) of the computer network. Alternatively, the network controller may discover the topology of the computer network through a series of messages through the computer network.

At 520, the network controller determines whether the network topology includes separable stages of network elements, such that any network flow goes through only one network element in a stage. If the network topology does include one or more separable stages, then the network controller generates a reordering sequence for each stage at 530. Since no packet will pass through more than one network element in a single stage, there is no risk of polarization of the ECMP routing protocol from having multiple network elements route packets according to the same algorithm. At 540, the network controller sends an indication to each network element in a separable stage of the reordering sequence corresponding to the stage to which the network element belongs.

Once the network controller has determined the reordering sequence for any network elements in a separable stage, or if the network topology does not include any separable stages as determined at 520, the network controller generates an individual reordering sequence for each remaining network element in the computer network at 550. At 560, the network controller sends an indication of the individual reordering sequence for each remaining network element in the computer network. In one example, the network controller may determine and distribute individual reordering sequences for all of the network elements in the computer network, regardless of whether the network topology includes separable stages. However, as the number of network elements in the computer network increases and approaches the number of possible reordering sequences, requiring individual reordering sequences for each network element may present challenges that can be solved by assigning the same reordering sequence to multiple network elements in stages. Additionally, the number of possible reordering sequences may be increased by increasing the number of blocks that are reordered. For instance, the LBFV may be partitioned into sixteen blocks instead of eight blocks to increase the number of potential reordering sequences.

Figure 6:
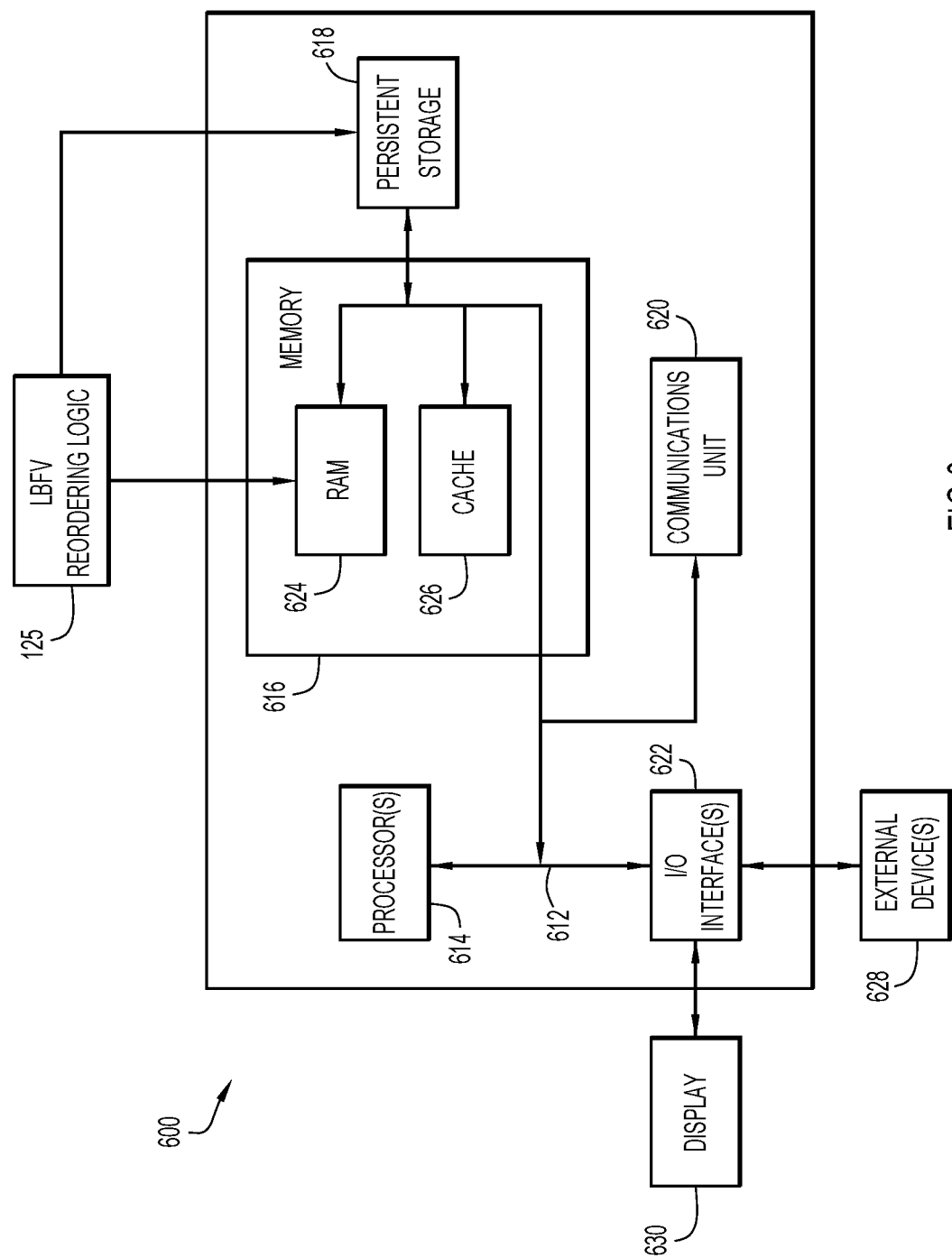
FIG. 6 illustrates a simplified block diagram of a device that may be configured to perform the methods presented herein, according to an example embodiment.

Referring now to FIG. 6, a hardware block diagram illustrates a computing device 600 that may perform the functions of any of the servers or computing or control entities (e.g., network element 120) referred to herein in connection with the ECMP routing system described herein. It should be appreciated that FIG. 6 provides only an illustration of one embodiment and does not imply any limitations with regard to the environments in which different embodiments may be implemented. Many modifications to the depicted environment may be made.

As depicted, the device 600 includes a bus 612, which provides communications between computer processor(s) 614, memory 616, persistent storage 618, communications unit 620, and input/output (I/O) interface(s) 622. Bus 612 can be implemented with any architecture designed for passing data and/or control information between processors (such as microprocessors, communications and network processors, etc.), system memory, peripheral devices, and any other hardware components within a system. For example, bus 612 can be implemented with one or more buses.

Memory 616 and persistent storage 618 are computer readable storage media. In the depicted embodiment, memory 616 includes random access memory (RAM) 624 and cache memory 626. In general, memory 616 can include any suitable volatile or non-volatile computer readable storage media. Instructions for the LBFV reordering logic 125 may be stored in memory 616 or persistent storage 618 for execution by processor(s) 614.

One or more programs may be stored in persistent storage 618 for execution by one or more of the respective computer processors 614 via one or more memories of memory 616. The persistent storage 618 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 618 may also be removable. For example, a removable hard drive may be used for persistent storage 618. Other examples include optical and magnetic disks, thumb drives, and smart cards that are inserted into a drive for transfer onto another computer readable storage medium that is also part of persistent storage 618.

Communications unit 620, in these examples, provides for communications with other data processing systems or devices (e.g., network element 120). In these examples, communications unit 620 includes one or more network interface units, such as network interface cards. Communications unit 620 may provide communications through the use of either or both physical and wireless communications links.

I/O interface(s) 622 allows for input and output of data with other devices that may be connected to computer device 600. For example, I/O interface 622 may provide a connection to external devices 628 such as a keyboard, keypad, a touch screen, and/or some other suitable input device. External devices 628 can also include portable computer readable storage media such as database systems, thumb drives, portable optical or magnetic disks, and memory cards.

Software and data used to practice embodiments can be stored on such portable computer readable storage media and can be loaded onto persistent storage 618 via I/O interface(s) 622. I/O interface(s) 622 may also connect to a display 630. Display 630 provides a mechanism to display data to a user and may be, for example, a computer monitor.

The programs described herein are identified based upon the application for which they are implemented in a specific embodiment. However, it should be appreciated that any particular program nomenclature herein is used merely for convenience, and thus the embodiments should not be limited to use solely in any specific application identified and/or implied by such nomenclature.

Data relating to operations described herein may be stored within any conventional or other data structures (e.g., files, arrays, lists, stacks, queues, records, etc.) and may be stored in any desired storage unit (e.g., database, data or other repositories, queue, etc.). The data transmitted between entities may include any desired format and arrangement, and may include any quantity of any types of fields of any size to store the data. The definition and data model for any datasets may indicate the overall structure in any desired fashion (e.g., computer-related languages, graphical representation, listing, etc.).

The present embodiments may employ any number of any type of user interface (e.g., Graphical User Interface (GUI), command-line, prompt, etc.) for obtaining or providing information (e.g., data relating to scraping network sites), where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, etc.). The interface screens may include any suitable actuators (e.g., links, tabs, etc.) to navigate between the screens in any fashion.

The environment of the present embodiments may include any number of computer or other processing systems (e.g., client or end-user systems, server systems, etc.) and databases or other repositories arranged in any desired fashion, where the present embodiments may be applied to any desired type of computing environment (e.g., cloud computing, client-server, network computing, mainframe, stand-alone systems, etc.). The computer or other processing systems employed by the present embodiments may be implemented by any number of any personal or other type of computer or processing system (e.g., desktop, laptop, PDA, mobile devices, etc.), and may include any commercially available operating system and any combination of commercially available and custom software (e.g., machine learning software, etc.). These systems may include any types of monitors and input devices (e.g., keyboard, mouse, voice recognition, etc.) to enter and/or view information.

It is to be understood that the software of the present embodiments may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control. The computer systems of the present embodiments may alternatively be implemented by any type of hardware and/or other processing circuitry.

Each of the elements described herein may couple to and/or interact with one another through interfaces and/or through any other suitable connection (wired or wireless) that provides a viable pathway for communications. Interconnections, interfaces, and variations thereof discussed herein may be utilized to provide connections among elements in a system and/or may be utilized to provide communications, interactions, operations, etc. among elements that may be directly or indirectly connected in the system. Any combination of interfaces can be provided for elements described herein in order to facilitate operations as discussed for various embodiments described herein.

The various functions of the computer or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, Intranet, Internet, hardwire, modem connection, wireless, etc.). For example, the functions of the present embodiments may be distributed in any manner among the various end-user/client and server systems, and/or any other intermediary processing devices. The software and/or algorithms described above and illustrated in the flow charts may be modified in any manner that accomplishes the functions described herein. In addition, the functions in the flow charts or description may be performed in any order that accomplishes a desired operation.

The software of the present embodiments may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The communication network may be implemented by any number of any type of communications network (e.g., LAN, Internet, Intranet, VPN, etc.). The computer or other processing systems of the present embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, Intranet, etc.).

The system may employ any number of any conventional or other databases, data stores or storage structures (e.g., files, databases, data structures, data or other repositories, etc.) to store information (e.g., data relating to contact center interaction routing). The database system may be implemented by any number of any conventional or other databases, data stores or storage structures (e.g., files, databases, data structures, data or other repositories, etc.) to store information (e.g., data relating to contact center interaction routing). The database system may be included within or coupled to the server and/or client systems. The database systems and/or storage structures may be remote from or local to the computer or other processing systems, and may store any desired data (e.g., data relating to contact center interaction routing).

The embodiments presented may be in various forms, such as a system, a method, and/or a computer program product at any possible technical detail level of integration. The computer program product may include a computer readable storage medium (or media) having computer readable program instructions thereon for causing a processor to carry out aspects of presented herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects presented herein.

Aspects of the present embodiments are described herein with reference to flowchart illustrations and/or block diagrams of methods, apparatus (systems), and computer program products according to the embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

In summary, the techniques presented herein provide for optimizing network utilization in ECMP routed computer networks. To avoid polarization across multiple network elements/stages, each network elements differentiates the Load-Balancing Flow-Vector generation so that the selection of an outgoing link is not correlated with the selection made by a predecessor network element. In particular, the techniques presented herein may be applied to existing silicon devices without a need for a re-spin of the devices.

In one form, a method is provided to efficiently load balance packets through a network. The method includes receiving a packet associated with flow attributes at a first network element. The first network element is connected to a plurality of second network elements of a computer network. The method also includes generating a Load Balancing Flow Vector (LBFV) from the flow attributes, and partitioning the LBFV into a plurality of LBFV blocks. The method further includes reordering the LBFV blocks at the first network element to generate a reordered LBFV. The LBFV blocks are reordered based on a first reordering sequence that is different from reordering sequences on the plurality of second network elements. The method also includes hashing the reordered LBFV to generate a hash key for the packet and selecting a next hop link based on the hash key. The next hop link connects the first network elements to a next hop network element among the plurality of second network elements.

In another form, an apparatus comprising a network interface and a processor is provided. The network interface is configured to communicate with a plurality of network elements in a computer network. The processor is coupled to the network interface and configured to receive via the network interface, a packet associated with flow attributes. The processor is also configured to generate an LBFV from the flow attributes and partition the LBFV into a plurality of LBFV blocks. The processor is further configured to reorder the LBFV to generate a reordered LBFV based on a first reordering sequence that is different from reordering sequences on the plurality of network elements. The processor is also configured to hash the reordered LBFV to generate a hash key and select a next hop link based on the hash key. The next hop link connects the apparatus to a next hop network element among the plurality of network elements.

In a further form, a method is provided to efficiently load balance packets through a network. The method includes receiving a packet associated with flow attributes at a first network element. The first network element is connected to a plurality of second network elements of a computer network. The method also includes generating a Load Balancing Flow Vector (LBFV) from the flow attributes, and hashing the LBFV into a hash key for the packet. The method further includes partitioning the hash key into hash key blocks and reordering the hash key blocks at the first network element to generate a reordered hash key. The hash key blocks are reordered based on a first reordering sequence that is different from reordering sequences on the plurality of second network elements. The method also includes selecting a next hop link based on the reordered hash key. The next hop link connects the first network elements to a next hop network element among the plurality of second network elements.

In still another form, a system comprising a first network element and a second network element is provided. The first network element is configured to receive a packet associated with flow attributes and generate an LBFV from the flow attributes. The first network element is also configured to partition the LBFV into a plurality of LBFV blocks and reorder the LBFV blocks to generate a first reordered LBFV. The first network element reorders the LBFV blocks based on a first reordering sequence. The first network element is further configured to hash the first reordered LBFV to generate a first hash key for the packet and selects a next hop link based on the first hash key. The first network element is also configured to send the packet from the first network element via the next hop link. The second network element is configured to receive the packet with the flow attributes from the first network element and generate the LBFV from the flow attributes. The second network element is also configured to partition the LBFV into the plurality of LBFV blocks and reorder the LBFV blocks to generate a second reordered LBFV. The LBFV blocks are reordered at the second network element according to a second reordering sequence that is different than the first reordering sequence. The second network element is further configured to hash the second reordered LBFV to generate a second hash key for the packet and select a subsequent hop link based on the second hash key. The second network element is also configured to send the packet from the second network element via the subsequent hop link.

In yet another form, a non-transitory computer readable storage media is provided that is encoded with instructions that, when executed by a processor of a first network element, cause the processor to receive a packet associated with flow attributes at the first network element. The first network element is connected to a plurality of second network elements of a computer network. The instructions also cause the processor to generate an LBFV from the flow attributes, and partition the LBFV into a plurality of LBFV blocks. The instructions further cause the processor to reorder the LBFV blocks and generate a reordered LBFV. The LBFV blocks are reordered at the first network element based on a first reordering sequence that is different from reordering sequences on the plurality of second network elements. The instructions also cause the processor to hash the reordered LBFV to generate a hash key for the packet and select a next hop link based on the hash key. The next hop link connects the first network elements to a next hop network element among the plurality of second network elements.

The flowchart and block diagrams in the figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. In particular, hashing the LBFV may be performed before applying the reordering sequence, with the reordering sequence being applied to the hash key generated from hashing the LBFV. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   at a first network element connected to a plurality of second network elements of a computer network, receiving a packet associated with flow attributes;
   generating a Load Balancing Flow Vector (LBFV) from the flow attributes;
   partitioning the LBFV into a plurality of LBFV blocks;
   reordering the LBFV blocks at the first network element to generate a reordered LBFV, wherein the LBFV blocks are reordered based on a first reordering sequence that is different from reordering sequences on the plurality of second network elements;
   hashing the reordered LBFV to generate a hash key for the packet; and
   selecting a next hop link based on the hash key, wherein the next hop link connects the first network element to a next hop network element among the plurality of second network elements.

2. The method of claim 1, further comprising sending the packet to the next hop network element via the next hop link.

3. The method of claim 1, further comprising receiving an indication of the first reordering sequence from a network controller of the computer network.

4. The method of claim 1, wherein hashing the reordered LBFV comprises computing a remainder of a Cyclic Redundancy Check (CRC) function on the reordered LBFV, wherein the remainder of the CRC function is the hash key for the packet.

5. The method of claim 1, further comprising adding a predetermined number to the reordered LBFV before hashing the reordered LBFV, wherein the predetermined number is unique to the first network element.

6. The method of claim 1, wherein selecting the next hop link based on the hash key comprises calculating a modulo operation on the hash key.

7. The method of claim 1, wherein the computer network uses Equal-Cost Multi-Path (ECMP) routing to determine a path for the packet.

8. An apparatus comprising:
   a network interface configured to communicate with a plurality of network elements in a computer network; and
   a processor coupled to the network interface, the processor configured to:
     receive a packet via the network interface, the packet associated with flow attributes;
     generate a Load Balancing Flow Vector (LBFV) from the flow attributes;
     partition the LBFV into a plurality of LBFV blocks;
     reorder the LBFV blocks to generate a reordered LBFV, wherein the LBFV blocks are reordered based on a first reordering sequence that is different from reordering sequences on the plurality of network elements;
     hash the reordered LBFV to generate a hash key for the packet; and
     select a next hop link based on the hash key, wherein the next hop link connects the apparatus to a next hop network element among the plurality of network elements.

9. The apparatus of claim 8, wherein the network interface is further configured to send the packet to the next hop network element via the next hop link.

10. The apparatus of claim 8, wherein the processor is further configured to receive an indication of the first reordering sequence from a network controller of the computer network via the network interface.

11. The apparatus of claim 8, wherein the processor is configured to hash the reordered LBFV by computing a remainder of a Cyclic Redundancy Check (CRC) function on the reordered LBFV, wherein the remainder is the hash key for the packet.

12. The apparatus of claim 8, wherein the processor is further configured to add a predetermined number to the reordered LBFV before hashing the reordered LBFV, wherein the predetermined number is unique to the apparatus.

13. The apparatus of claim 8, wherein the processor is configured to select the next hop link based on the hash key by calculating a modulo operation on the hash key.

14. The apparatus of claim 8, wherein the apparatus is a first network element in the computer network that uses Equal-Cost Multi-Path (ECMP) routing to determine a path for the packet.

15. A method comprising:
at a first network element connected to a plurality of second network elements of a computer network, receiving a packet associated with flow attributes;
generating a Load Balancing Flow Vector (LBFV) from the flow attributes;
hashing the LBFV to generate a hash key for the packet;
partitioning the hash key into a plurality of hash key blocks;
reordering the hash key blocks at the first network element to generate a reordered hash key, wherein the hash key blocks are reordered based on a first reordering sequence that is different from reordering sequences on the plurality of second network elements; and
selecting a next hop link based on the reordered hash key, wherein the next hop link connects the first network element to a next hop network element among the plurality of second network elements.

16. The method of claim 15, further comprising sending the packet to the next hop network element via the next hop link.

17. The method of claim 15, further comprising receiving an indication of the first reordering sequence from a network controller of the computer network.

18. The method of claim 15, wherein hashing the LBFV comprises computing a remainder of a Cyclic Redundancy Check (CRC) function on the LBFV, wherein the remainder of the CRC function is the hash key for the packet.

19. The method of claim 15, further comprising adding a predetermined number to the LBFV before hashing the LBFV, wherein the predetermined number is unique to the first network element.

20. The method of claim 15, wherein selecting the next hop link based on the reordered hash key comprises calculating a modulo operation on the reordered hash key.

* * * * *